(12) United States Patent
Harwood

(10) Patent No.: US 6,873,214 B2
(45) Date of Patent: Mar. 29, 2005

(54) USE OF CONFIGURABLE CAPACITORS TO TUNE A SELF BIASED PHASE LOCKED LOOP

(75) Inventor: Michael Harwood, Rushden (GB)

(73) Assignee: Texas Instruments Incorporated, Dallas, TX (US)

( * ) Notice: Subject to any disclaimer, the term of this patent is extended or adjusted under 35 U.S.C. 154(b) by 37 days.

(21) Appl. No.: 10/138,391

(22) Filed: May 3, 2002

(65) Prior Publication Data

US 2003/0206066 A1 Nov. 6, 2003

(51) Int. Cl.$^7$ ................................................ H03L 7/60
(52) U.S. Cl. ...................... 331/17; 331/36 R; 327/156; 327/553
(58) Field of Search .............................. 331/17, 25, 14, 331/16, 36 R, 36 C; 327/156, 552, 553, 554, 558

(56) References Cited

U.S. PATENT DOCUMENTS

| | | | |
|---|---|---|---|
| 4,928,075 A | | 5/1990 | Leis |
| 5,420,545 A | | 5/1995 | Davis et al. |
| 6,097,227 A | * | 8/2000 | Hayashi ...................... 327/158 |
| 6,101,257 A | * | 8/2000 | Lubbe et al. ............... 381/101 |
| 6,137,372 A | * | 10/2000 | Welland .................. 331/117 R |
| 6,211,745 B1 | * | 4/2001 | Mucke et al. ........... 331/117 R |
| 6,373,304 B1 | * | 4/2002 | Drost et al. .................. 327/157 |
| 6,462,594 B1 | * | 10/2002 | Robinson et al. ........... 327/159 |

FOREIGN PATENT DOCUMENTS

| | | |
|---|---|---|
| EP | 0 461 358 A1 | 12/1991 |
| EP | 1 005 167 A1 | 5/2000 |
| GB | 2 282 285 | 3/1995 |

OTHER PUBLICATIONS

Michael Harwood, "Improvements in or Relating to Phase Locked Loops" British Patent Application No. 0030859.3, Filed Dec. 18, 2000.

Matsushita Abstract PAJ vol. 1994, No. 018661.

* cited by examiner

Primary Examiner—Timothy P. Callahan
Assistant Examiner—An T. Luu
(74) Attorney, Agent, or Firm—Rose Alyssa Keagy; W. James Brady, III; Frederick J. Telecky, Jr.

(57) ABSTRACT

A phase locked loop (PLL) comprising an input, an output, a charge generator, a low pass filter 3, an oscillator 4 and a frequency divider 5. The frequency divider 5 has an input coupled to the output of the PLL and an output coupled to an input of the charge generator. The frequency at the output of the frequency divider 5 is equal to the frequency at the input of the frequency divider divided by a selectable divider ratio N. The PLL has a damping factor z and a bandwidth to compare frequency ratio $\omega_3/\omega_{ref}$. The low pass filter 3 has a first capacitor for integrating the charge produced by the charge generator. The capacitance of that first capacitor is arranged to be proportional to the divider ratio N so that the damping factor z and the bandwidth to compare frequency ratio $\omega_3/\omega_{ref}$ are substantially independent of the divider ratio N.

23 Claims, 4 Drawing Sheets

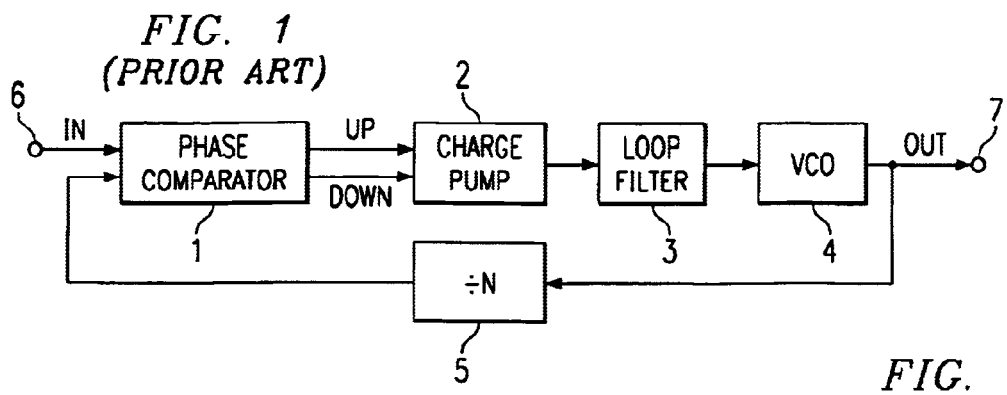
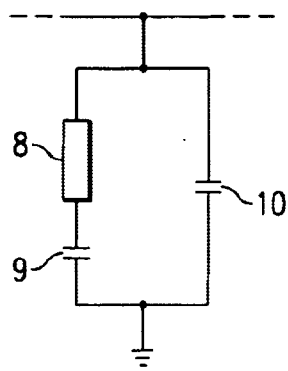
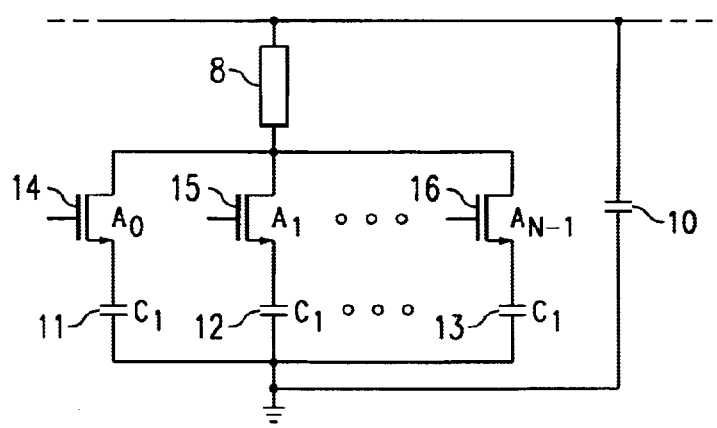
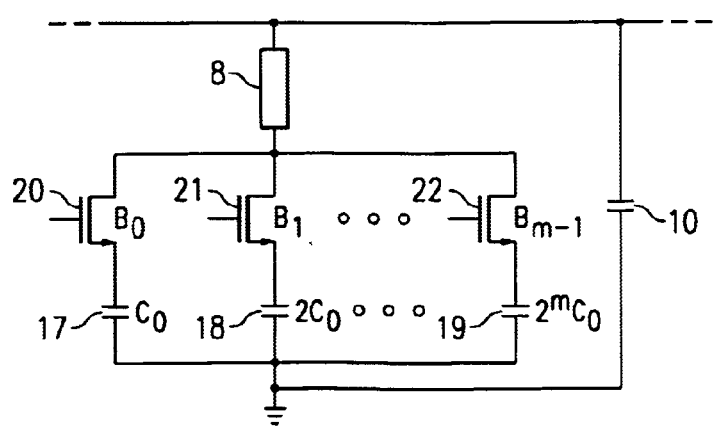

USE OF CONFIGURABLE CAPACITORS TO TUNE A SELF BIASED PHASE LOCKED LOOP

BACKGROUND OF THE INVENTION

The present invention relates to phase locked loops (PLLs) and more particularly to "self-biased" PLLs with dynamic parameters that are substantially independent of a PLL divider ratio. The term "self-biased PLL" is used (see the Maneatis paper cited below) to describe a PLL in which the bias current of the charge pump is self-regulating and adapts for other circuit tolerances.

FIG. 1 shows a block diagram of a general form of one kind of PLL, that general form being known in the art. The circuit of FIG. 1 comprises a phase comparator 1, a charge pump 2, a loop filter 3, a voltage controlled oscillator (VCO) 4 and a frequency divider 5 and has an input 6 and an output 7. The phase comparator 1 has two inputs and two outputs. The charge pump 2 has two inputs and an output. Each one of the loop filter 3, the VCO 4 and the frequency divider 5 have an input and an output. The first input of the phase comparator 1 is coupled to the input 6 of the PLL and the second input of the phase comparator is coupled to the output of the frequency divider 5. First and second of the outputs of the phase comparator 1 are respectively coupled to first and second of the inputs of the charge pump 2, the output of the charge pump 2 is coupled to the input of the loop filter 3 and the output of the loop filter 3 is coupled to the input of the VCO 4. The input and output of the loop filter 3 are coupled together. The output of the VCO 4 is coupled to both the output 7 of the PLL and the input of the frequency divider 5. The VCO 4 might alternatively have two differential outputs, or more than two outputs providing a multi-phase output.

The frequency of the signal at the output 7 of the PLL is N times the frequency of the signal at the input 6 of the PLL. N is the divider ratio of the frequency divider 5 so that the frequency at each of the inputs to the phase comparator 1 should be the same. The outputs of the phase comparator 1 are dependent on the phase difference between the two inputs of the phase comparator, one of those outputs indicating that the PLL output 7 is advanced relative to the input, the other indicating that that output is retarded. The outputs of the phase comparator 1 cause the charge pump to increase or decrease respectively the current input to the loop filter 3, and hence the voltage supplied to the VCO 4, accordingly. The phase comparator 1 could be replaced with a frequency comparator or with a combined frequency and phase comparator. The PLL is arranged so that when the frequency at the output of the frequency divider 5 is higher than the frequency at the PLL input 6, the output of the charge pump 2 is such that the frequency at the output 7 of the PLL is reduced and when the frequency at the output of the frequency divider 5 is lower than the frequency at the PLL input 6 the output of the charge pump 2 is such that the frequency at the output 7 of the PLL is increased. Thus the PLL has a feedback loop that forces the frequency at the output of the frequency divider towards the frequency at the input 6. With suitable conditions, the frequency at the output of the PLL will lock to the frequency at the input of the PLL and the output will follow any changes in the frequency or phase of the input to the PLL. The inputs of the phase comparator may have the same phase when in lock or may have some other phase relationship, such as being 90° out of phase.

The loop filter 3 is a low pass filter that prevents the output of the PLL from being unstable. The frequency response of the low pass filter is essentially a balance between ensuring that the cut-off frequency is high enough to enable the PLL to track input frequency variations and power supply noise but low enough to smooth over noise in the input signal to ensure that the PLL is stable. The design of the loop filter 3 will depend, amongst other things, on the application but a typical circuit that is used is shown in FIG. 2. FIG. 2 shows a resistor 8 with a first terminal connected to a first terminal of the loop filter and a second terminal connected to a first terminal of a first capacitor 9, the first capacitor having a second terminal connected to a second terminal of the loop filter. The filter also has a second capacitor 10 with first and second terminals connected to the first and second terminals of the loop filter respectively. The first terminal of the loop filter 3 is connected to both the output of the charge pump 2 and the input of the VCO 4 and the second terminal of the loop filter is connected to ground.

Two dynamic parameters of the PLL of FIG. 1 are a damping factor z and a bandwidth to compare frequency ratio $\omega_3/\omega_{ref}$. The damping factor is a measure of the time it takes the circuit to return to a near ideal position after being disturbed. With a damping factor of 1, the PLL is critically damped, with a damping factor greater or less than 1, the PLL is over- or under-damped respectively. $\omega_3$ is the 3 dB frequency of the PLL, that is the frequency at which the open loop phase response of the PLL is $1/\sqrt{2}$ of its maximum. $\omega_{ref}$ is the compare rate of the PLL that is the frequency of operation of the phase comparator (i.e. the frequency of the input signal at terminal 6).

The formulae for z and $\omega_3/\omega_{ref}$ are known in the art (see, for example, Chapter 2 of Gardner "Phaselock Techniques", John Wiley & Sons, Second edition) and are:

$$z = \frac{1}{2}\sqrt{\frac{k_D I_P R^2 C}{2\pi N}}$$

$$\frac{\omega_3}{\omega_{ref}} = \frac{k_D I_P R}{2\pi N \omega_{ref}}$$

wherein $k_D$ is a gain (radians/volt-second) of the VCO, $I_p$ is the output current of the charge pump, R and C are the resistance and capacitance of the resistor 8 and the first capacitor 9 respectively in the loop filter and N is the frequency divider ratio.

The bandwidth to compare frequency ratio $\omega_3/\omega_{ref}$ is dependent on the PLL compare frequency itself and so any desired numerical value for $\omega_3/\omega_{ref}$ should preferably be satisfied for all values of $\omega_{ref}$.

One measure of the performance of a PLL is the jitter that is seen at the output. Jitter is the deviation from the required edge position that is seen at the output of the PLL. Low-jitter PLLs result from optimising the dynamic parameters of PLLs. Two problems that have been identified in the optimisation are (1) the variation of component values, and therefore the dynamic parameters of the PLL, as a result of manufacturing tolerances in those components, and (2) the use of selectable frequency dividers so that the output can be at a selected multiple of the input frequency, when the dynamic parameters are usually optimised at one or more operating frequencies but not at others.

The bandwidth to compare frequency ratio $\omega_3/\omega_{ref}$ is dependent on the value of R in the loop filter 3 and the divider ratio N. The damping factor z is dependent on the values of R and C in the loop filter 3 and the divider ratio N. Thus both the bandwidth to compare frequency ratio and the damping factor are subject to both of the problems identified above.

The dynamic parameters z and $\omega_3/\omega_{ref}$ can be made substantially independent of the frequency divider ratio N using the technique disclosed in "A 2-1600-MHz CMOS Clock Recovery PLL with Low-Vdd Capability" (IEEE Journal of Solid-State Circuits, Vol. 34, No. 12, pp. 1951 to 1960) (Larsson). That article suggests setting the charge pump current to be proportional to the divider ratio N, so that:

$$I_p = N \cdot I_{bias}$$

where $I_{bias}$ is a constant current provided by a bias circuit. Thus the formulae for z and $\omega_3/\omega_{ref}$ above are reduced to:

$$z = \frac{1}{2}\sqrt{\frac{k_D I_{bias} R^2 C}{2\pi}}$$

and $$\frac{\omega_3}{\omega_{ref}} = \frac{k_D I_{bias} R}{2\pi \omega_{ref}}$$

The dependence of both the damping factor z and the bandwidth to compare frequency ratio $\omega_3/\omega_{ref}$ on the manufacturing tolerances of the components in the loop filter 3 is unaffected, as is the dependence of the bandwidth to compare frequency ratio on the compare rate $\omega_{ref}$.

The variation of component values as a result of manufacturing tolerances affecting the value of z and $\omega_3/\omega_{ref}$ can be substantially reduced (but not eliminated) by the use of "self-biased" PLLs as in "Low-Jitter Process-Independent DLL and PLL Based on Self-Biased Techniques" (IEEE Journal of Solid-State Circuits, Vol. 31, No. 11 pages 1723 to 1732) (Maneatis). In that paper, a "self-biased" PLL is disclosed in which R is made inversely proportional to the square root of a bias current, which is again termed $I_{bias}$, $I_p$ is made proportional to $I_{bias}$ and the output frequency is made proportional to the square root of $I_{bias}$. Thus:

$$z = \frac{1}{2}\sqrt{\frac{k_D a^2 b C}{2\pi N}}$$

and $$\frac{\omega_3}{\omega_{ref}} = \frac{k_D a b}{2\pi d}$$

where $$R = \frac{a}{\sqrt{I_{bias}}};\ I_P = b \cdot I_{bias};\ \text{and}\ \omega_{out} = d\sqrt{I_{bias}}\ (= N \cdot \omega_{ref})$$

a, b and d being constants, but not necessarily independent of each other. Note that here $I_{bias}$ is not constant in all circumstances but will vary with the output frequency of the circuit, which it controls, if for example the input reference frequency changes.

As discussed in Maneatis, a resistor with a resistance inversely proportional to the square root of the bias current can be obtained by using a MOSFET as an active resistor. For example, by connecting the gate of an MOS transistor to the drain of that transistor and applying a current to the drain of that transistor, the resistance between the source and the drain of the device is approximately inversely proportional to the square root of the current supplied to the drain.

The frequency at the output of a typical VCO is set by the value of an RC time constant in which the value of R is set using an active resistor as described above. Thus the frequency of oscillation (proportional to 1/RC) is made proportional to the square root of a bias current applied to that active resistor, as required by the formula above. The slope of the output frequency against $I_{bias}$ graph gives the constant d.

It can be seen from the equations above that the self-biased PLL substantially reduces the effect of the first problem identified above (i.e. the variation of component values due to manufacturing tolerances) since the formula for $\omega_3/\omega_{ref}$ is independent of such tolerances and the damping factor z is dependent on the square root of the loop filter capacitance rather than on the loop filter resistance and the square root of the loop filter capacitance. Another significant advantage of the self-biased PLL is that $\omega_3/\omega_{ref}$ is not dependent on the PLL compare rate $\omega_{ref}$.

However, for the self-biased PLL described in the Maneatis paper, the damping factor z is once again dependent on the frequency divider ratio N. The inventor has noted that this can be solved if $$I_p = N \cdot b \cdot I_{bias}$$

but this makes $\omega_3/\omega_{ref}$ dependent upon N.

Thus whilst attempts have been made to solve the two problems associated with low-jitter PLLs identified above, namely the variation of component values, and therefore the dynamic parameters of the PLL, as a result of manufacturing tolerances in the components and the optimisation of dynamic parameters at some operating frequencies but not at others in phase locked loops with selectable frequency dividers, there remains a need for a phase locked loop with a selectable frequency divider that has a damping factor z and a bandwidth to compare frequency ratio $\omega_3/\omega_{ref}$ that are both substantially independent of the frequency divider ratio N, and for which $\omega_3/\omega_{ref}$ is independent of the compare frequency $\omega_{ref}$.

BRIEF DESCRIPTION OF THE DRAWINGS

A phase locked loop in accordance with the invention will now be described by way of example with reference to the accompanying drawings, in which FIG. 1 is a block diagram of a prior art phase locked loop;

FIG. 2 is a circuit diagram of a prior art loop filter used in phase locked loops;

FIG. 3 is a circuit diagram of a loop filter in accordance with a first embodiment of the invention;

FIG. 4 is a circuit diagram of a loop filter in accordance with a second embodiment of the invention;

DETAILED DESCRIPTION OF THE INVENTION

Figure 5:
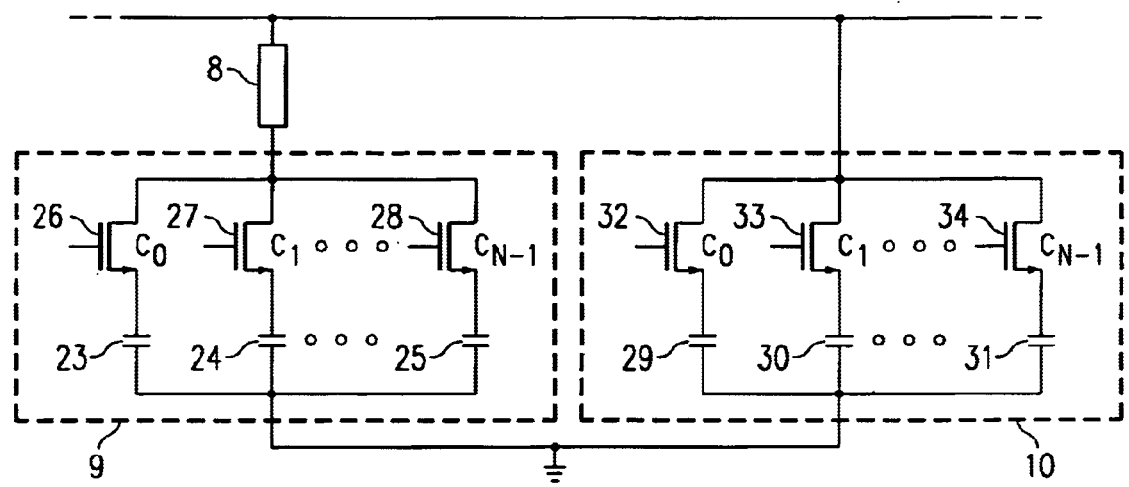
FIG. 5 is a circuit diagram of a loop filter in accordance with a third embodiment of the invention.

A first embodiment of the present invention has the general form shown in FIG. 1 with a loop filter of the form shown in FIG. 2. The loop filter 3 is, however, modified by generating the first capacitor 9 from a plurality of capacitors 11, 12 and 13 that can be turned on or off using a bank of switches as shown in FIG. 3. The circuit of FIG. 3 comprises n capacitors in parallel. Each limb of the capacitor bank of FIG. 3 comprises an NMOS transistor 14, 15 and 16 and a respective capacitor 11, 12 and 13 connected between the second terminal of resistor 8 and ground.

Control signals $A_0, A_1 \ldots A_{N-1}$ are applied to the gates of transistors 14, 15 and 16 respectively. By turning on N transistors by applying suitable control signals (where N is the divider ratio), the effective capacitance of the capacitor bank (i.e. the first capacitance) is made proportional to the divider ratio N, provided that all of the capacitors 11, 12 and 13 have substantially the same capacitance ($C_1$). This circuit is particularly suitable for use in integrated circuits, since capacitors fabricated in the same process at the same time are usually well matched. Of course, the number of capacitor/transistor limbs in the circuit of FIG. 3 must be at least equal to the highest allowable value for the divider ratio N.

The effect of the use of the capacitor bank of FIG. 3 in the loop filter 3 of FIG. 2 to implement the first capacitor 9 on the performance of the self-biased PLL described above can be seen by examining the effect on the damping factor and the bandwidth to compare frequency ratio.

The formulae for the damping factor and the bandwidth to compare frequency ratio for a general phase locked loop are once again:

$$z = \frac{1}{2}\sqrt{\frac{k_D I_P R^2 C}{2\pi N}}$$

and $$\frac{\omega_3}{\omega_{ref}} = \frac{k_D I_P R}{2\pi N \omega_{ref}}$$

The phase locked loop of the present invention also like Maneatis has preferably R inversely proportional to the square root of a bias current $I_{bias}$, $I_P$ is preferably proportional to $I_{bias}$ and the output frequency is preferably proportional to the square root of $I_{bias}$, (R, $I_{bias}$ and $\omega_{out}$ being generated as in Maneatis). Thus:

$$R = \frac{a}{\sqrt{I_{bias}}}; I_P = b \cdot I_{bias}; \omega_{out} = d\sqrt{I_{bias}} \ (= N \cdot \omega_{ref})$$

In addition, from the implementation of the first capacitor of the loop filter discussed above, we have:

$$C = NC_1$$

Thus the formulae for the damping factor and the bandwidth to compare frequency ratio are reduced to:

$$z = \frac{1}{2}\sqrt{\frac{k_D a^2 b C_1}{2\pi}}$$

and $$\frac{\omega_3}{\omega_{ref}} = \frac{k_D ab}{2\pi d}$$

The first embodiment of the present invention therefore provides a phase locked loop in which the damping factor z and the bandwidth to compare frequency ratio $\omega_3/\omega_{ref}$ are substantially independent of the divider ratio N by making the first capacitance in the loop filter 3 proportional to the divider ratio N. The PLL of the first embodiment of the invention also retains the advantages of the self-biased PLLs taught by Maneatis in that the bandwidth to compare frequency ratio is substantially independent of both the PLL compare rate and the manufacturing tolerances of the components used and the damping factor is dependent on the square root of the capacitance of the capacitor bank capacitors $C_1$ in the loop filter 3.

Note that the capacitor 10 is provided to reduce jitter in the PLL. (If it is made too large, however, the PLL can become unstable.)

FIG. 4 is a circuit diagram of an implementation of the loop filter of FIG. 2 in accordance with a second embodiment of the invention. The capacitors 11, 12 and 13 of FIG. 3 are replaced with binary weighted capacitors 17, 18 and 19 so that the capacitor 17 has capacitance Co, capacitor 18 has capacitance $2C_0$ and capacitor 19 has capacitance $2^{m-1}C_0$. Control signals $B_0, B_1 \ldots B_{m-1}$ control transistors 20, 21 and 22 respectively to determine which ones of the capacitors are enabled. By using these binary weighted capacitors, the number of capacitors required is reduced compared with the first embodiment of the invention. The capacitor banks of FIGS. 3 and 4 could be replaced with capacitors being switched by PMOS transistors.

In the loop filter 3 of FIG. 2, it is preferable to make the capacitance of capacitor 10 (the second capacitance) proportional to the capacitance of capacitor 9 (the first capacitance) for the stability of the PLL. Thus when the first capacitance is changed, as discussed in relation to the capacitor banks of FIGS. 3 and 4, the second capacitance should preferably be changed by the same proportion. The third embodiment of the invention provides a loop filter in which both of the capacitors in the loop filter are switchable. FIG. 5 shows a circuit diagram for the loop filter in accordance with the third embodiment of the invention.

In FIG. 5, the loop filter 3 of FIG. 2 is modified by implementing capacitor 9 using capacitors 23, 24 and 25 that can be switched on by NMOS transistors 26, 27 and 28 respectively and implementing capacitor 10 using capacitors 29, 30 and 31 that can be switched by NMOS transistors 32, 33 and 34 respectively. As discussed above in relation to the first embodiment of the invention, the capacitor banks of the third embodiment comprise n capacitors and n switching elements. Those switching elements may be NMOS or PMOS transistors or transmission gates. Transistors 26, 27 and 28 are controlled by control signals $C_0, C_1 \ldots C_{n-1}$ respectively as are transistors 32, 33 and 34. This ensures that the overall capacitance of the two capacitor banks are proportional to each other. The capacitors shown in each capacitor bank each have substantially the same capacitance. They may, of course, be replaced with binary weighted capacitors as discussed in relation to the second embodiment of the invention.

In the preferred embodiment the phase locked loop satisfies the relations for R, $I_P$ and $\omega_{out}$ given above. They are repeated here for ease of reference. The following explains in detail the preferred method for achieving those. This preferred method is generally that disclosed by the Maneatis reference.

$$R = \frac{a}{\sqrt{I_{bias}}}; I_P = b \cdot I_{bias}; \text{ and } \omega_{out} = d\sqrt{I_{bias}} \ (= N \cdot \omega_{ref})$$

Figure 6:
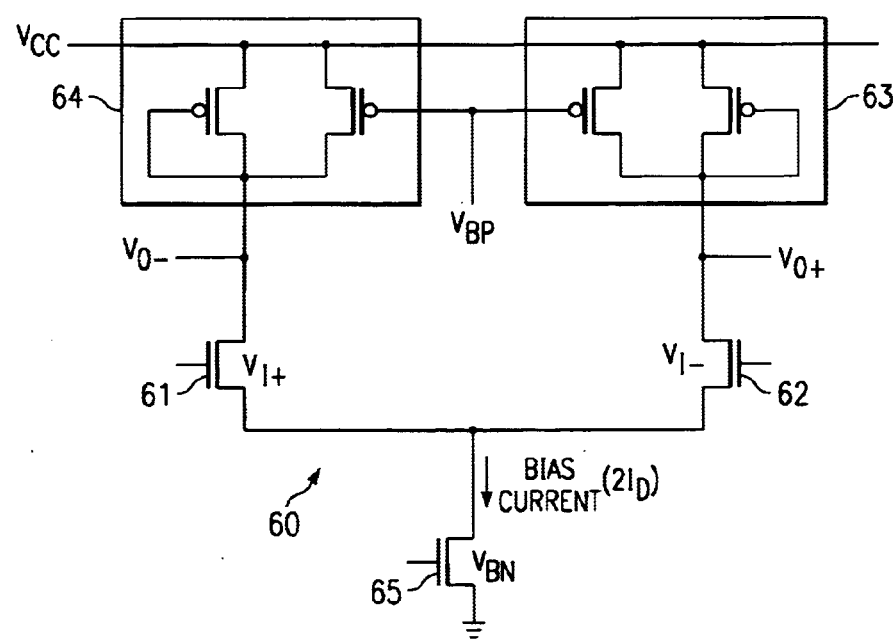
FIG. 6 is a circuit unit from which the oscillator of the phase locked loop is built.

FIG. 6 shows a circuit for the building block, a differential buffer delay stage 60, for the voltage controlled oscillator 4. The stage comprises a source coupled pair of NMOS transistors 61 and 62 each having a load 63 and 64 each comprising a diode connected PMOS transistor and in parallel with that another PMOS device biased by a voltage $V_{BP}$. The sources of transistors 61 and 62 are connected to a current source provided by an NMOS transistor 65 biased by a voltage $V_{BN}$ that provides a current proportional to the $I_{bias}$ of the relations given above.

The oscillator comprises an even number of the buffers 60 connected in a ring with the outputs $V_{O+}$ and $V_{O-}$ (at the drains of transistors 62 and 61) of each being connected respectively to the inputs $V_{I+}$ and $V_{I-}$ (the gates of transistors 62 and 61) of the next, except for one pair of buffers where the connection is crossed over compared to that.

Figure 7:
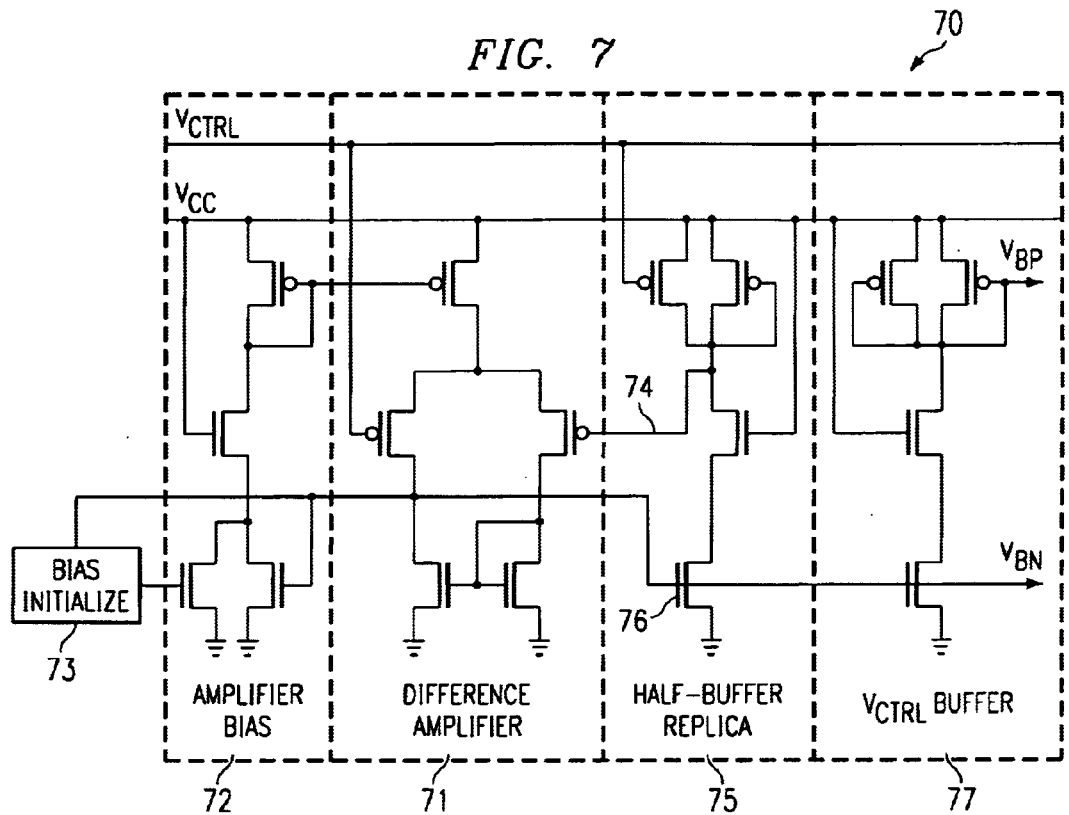
FIG. 7 is a biasing circuit for the phase locked loop circuit.

The bias voltages $V_{BP}$ and $V_{BN}$ are provided by the bias circuit 70 shown in FIG. 7. These are produced from the output $V_{CTRL}$ of the loop filter 3. The differential amplifier section 71 (which is biased by an amplifier bias section 72 which in turn is biased by an initial bias voltage from circuit 73) compares the output 74 of the half replica buffer section 75 with $V_{CTRL}$ and adjusts its output, which is $V_{BN}$, so that the current through the half replica buffer section, which is controlled by $V_{BN}$ via NMOS transistor 76, is such that the output 74 of the half replica buffer section 75 is substantially equal to $V_{CTRL}$-$V_{CTRL}$ buffer section 77 is identical to half-replica buffer section 75 except that where in the half replica buffer section the input of $V_{CTRL}$ is applied, the output $V_{BP}$ is fed back instead. This results in $V_{BP}$ being substantially equal to $V_{CTRL}$.

Refer again to FIG. 6. The PMOS transistors of loads 63 and 64 are equally sized and have greater than the minimum channel length and so the drain current is given simply by:

$$I_D = \frac{k}{2}(V_{CTRL} - V_T)^2$$

where $V_T$ is the threshold voltage and k is the transconductance of one of the PMOS devices of the load. The small signal transresistance of the PMOS transistor is therefore:

$$\frac{dV_{CTRL}}{dI_D} = \frac{1}{\sqrt{2kI_D}}$$

This resistance controls the frequency of the oscillator 4 (proportional to 1/(resistance×capacitance)) thus satisfying the relation for $\omega_{out}$ given above (taking $I_D$ as the bias current).

Figure 8:
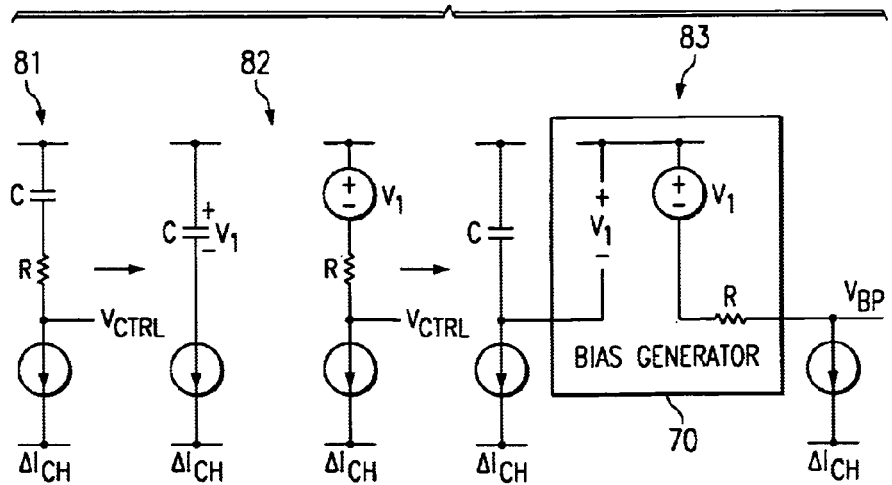
FIG. 8 shows a transformation of the loop filter circuit.
Figure 9:
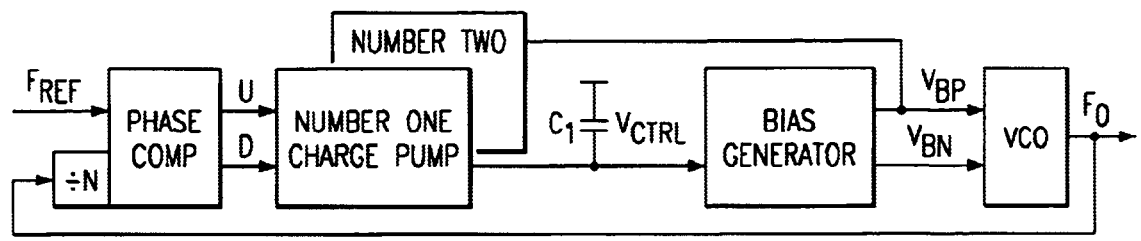
FIG. 9 is a block diagram of the phase locked loop circuit incorporating that transformation.

In the preferred embodiment the resistance R in the loop filter is provided as follows. FIG. 8 shows a transformation of that resistance. The voltage $V_1$ across the capacitor C of the loop filter 3 is provided by charge provided by the current $\Delta I_{CH}$ from the charge pump. The voltage across the resistance R of the loop filter 3 is provided by the same current. In the decomposition (81 to 82) two circuits are provided, one with a capacitor C of the same value, developing the voltage $V_1$, supplied by the current from the charge pump, and another having a resistance R of the same value, in series with a voltage source providing the same voltage $V_1$ as is across the capacitance C, supplied by an identical current $\Delta I_{CH}$. The bias generator 70 described above provides an output $V_{BP}$ that is substantially the voltage across the capacitance and resistance of the loop filter i.e. $V_{CTRL}$; further that output has a finite resistance (that of the PMOS loads of the buffer 77) that may be used to provide the resistance R as is shown at 83. For this arrangement 83 two identical charge pumps are required (responsive to identical inputs) to provide the currents $\Delta I_{CH}$ and so the final circuit is as shown in FIG. 9 in block diagram form, where the output of the second charge pump is applied to the output $V_{BP}$ of the bias generator as shown at 83 in FIG. 8. The output resistance R of the buffer 77 of the bias generator is (for the same reasons as given above concerning the role of the resistance in the frequency of the oscillator) inversely proportional to square root of the bias current in the buffer 77 provided by the NMOS transistor under the control of $V_{BP}$. That bias current is, of course, proportional to those in the oscillator and thus the relation for R is satisfied.

Figure 10:
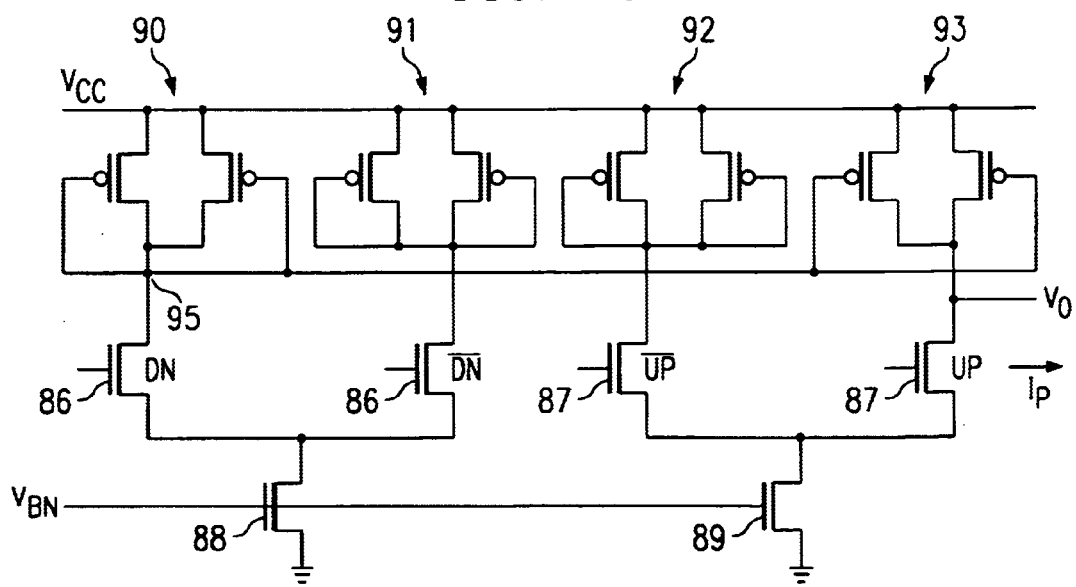
FIG. 10 is a circuit used for the charge pump.

The final relation to be satisfied is that for the current $I_P$ delivered by the charge pump, which is to be proportional to the same bias current as in the relations for the loop filter resistance and the output frequency of the oscillator. In the preferred embodiment this is achieved by using the charge pump circuit of FIG. 10. This circuit comprises two NMOS source coupled pairs 86, 87. The transistors of one pair 86 respectively receive the down signal DN from the phase comparator and that signal inverted $\overline{DN}$ at their gates and the other pair 87 similarly receives the up signal UP and that signal inverted $\overline{UP}$. (The UP and DN signals indicating whether the phase of the output of the oscillator should be advanced or retarded.) Each pair is connected at the sources of the transistors to a respective NMOS transistor current source that is controlled by $V_{BN}$ from the biasing circuit of FIG. 7, and each transistor of the pairs is connected at its drain to a respective pair 91, 92, 93, 94 of PMOS transistor loads. The PMOS transistors are mostly diode connected but the gates of those respective to the erect up signal UP are connected to the node 95 between the NMOS transistor receiving the erect down signal DN and its PMOS loads to form a current mirror. In this circuit the current delivered $I_P$ by the charge pump, if one or other of the UP or DN signals is asserted is proportional to the current $I_{bias}$ supplied by the current sources controlled by $V_{BN}$ which current is proportional to those identified above as $I_{bias}$ for the oscillator and the provision of the loop filter resistance R thus satisfying the relation. If both UP and DN is asserted at the same time the charge pump outputs $V_{CTRL}$ as may be seen by comparison of the circuit with the buffer stage 77 the bias circuit of FIG. 7, resulting in no change in the voltage on the loop filter which, of course, is $V_{CTRL}$.

What is claimed:

1. A phase locked loop comprising an input, an output, a charge generator, a loop filter, an oscillator and a frequency divider, the charge generator having a first input coupled to the input of the phase locked loop and an output coupled to an input of the loop filter, the loop filter having an output coupled to the input of the oscillator, the oscillator having an output coupled to both an input of the frequency divider and the output of the phase locked loop, and the frequency divider having an output coupled to a second input of the charge generator, wherein:

the frequency divider is arranged to output a frequency equal to the frequency output by the oscillator divided by a selectable divider ratio;

the charge generator is arranged to output a charge dependent upon the difference in phase between the signals at the first and second inputs to the charge generator, the output of the charge generator being such that, when the phase locked loop is in lock, the first and second inputs to the charge generator have a substantially constant phase relationship;

the loop filter has a first capacitor for integrating the charge produced by the charge generator, the capacitance of the first capacitor being selectable;

the circuit comprises selection means for selecting the divider ratio and the capacitance of the first capacitor so that they are proportional to each other; and the frequency at the output of the oscillator is dependent on the voltage at the output of the loop filter.

2. A phase locked loop as claimed in claim 1, wherein the charge output by the charge generator is proportional to a bias current, the phase locked loop comprises means acting as a resistance in series with the first capacitor, said resistance being inversely proportional to the square root of the bias current, and the frequency output by the phase locked loop is proportional to the square root of the bias current.

3. A phase locked loop as claimed in claim 1, wherein the first capacitor of the loop filter comprises a plurality of capacitive elements connected in parallel, each capacitive element connected in series with a switching element, the selection means being connected to operate the switching elements so as to determine the first capacitance of the loop filter.

4. A phase locked loop as claimed in claim 3, wherein each capacitive element has substantially the same capacitance and the number of switching elements that are set to be conducting is equal to the selectable divider ratio.

5. A phase locked loop as claimed in claim 3, wherein the capacitance of each capacitive element of the plurality has a capacitance $C_k 2^i$ where $C_k$ is a constant and i is an index from 0 to n−1 where n is the number of elements in the plurality.

6. A phase locked loop as claimed in claim 4, wherein the switching elements are NMOS transistors.

7. A phase locked loop as claimed in claim 4, wherein the switching elements are PMOS transistors.

8. A phase locked loop as claimed in claim 4, wherein the switching elements are transmission gates.

9. A phase locked loop as claimed in any preceding claim, wherein the charge generator comprises a phase comparator and a charge pump, the output of the phase comparator being dependent on the phase relationship between the first and second inputs of the charge generator.

10. A phase locked loop as claimed in claim 9, wherein the phase comparator has a first and a second output respectively coupled to a first and a second input of the charge pump, one of said phase comparator outputs indicating that the first input of the phase comparator is advanced with respect to the second input and the other of the said phase comparator outputs indicating that the first input of the phase comparator is retarded with respect to the second input, the inputs to the charge pump respectively causing the charge pump to increase or decrease the current input to the loop filter.

11. A method of designing a plurality of phase locked loops, each phase locked ioop comprising an input, an output, a charge generator, a low pass filter, an oscillator and a frequency divider, the charge generator having a first input coupled to the input of the phase locked loop and an output coupled to an input of the low pass filter, the low pass filter having an output coupled to the input of the oscillator, the oscillator having an output coupled to both an input of the frequency divider and the output of the phase locked loop, and the frequency divider having an output coupled to a second input of the charge generator, the low pass filter having a first capacitor for integrating the charge produced by the charge generator, the capacitance of the first capacitor being selectable, the method comprising, for each of the plurality of phase locked loops, the steps of:

arranging the frequency divider to output a frequency equal to the frequency output by the oscillator divided by a selectable divider ratio;

arranging the charge generator to output a charge dependent upon the difference in. phase between the signals at the first and second inputs to the charge generator, the output of the charge generator being such that, when the phase locked loop is in lock, the first and second inputs to the charge generator have a substantially constant phase relationship;

selecting the divider ratio and the capacitance of the first capacitor so that they are in the same proportion as for that other phase locked loops of the plurality; and arranging the frequency at the output of the oscillator to be dependent on the voltage at the output of the low pass filter.

12. A method of manufacturing a plurality of phase locked loops comprising the steps of:

designing each of the plurality of phase locked loops as claimed in claim 11; and manufacturing each of the plurality of phase locked loops to that design.

13. A method of controlling a phase locked loop, the phase locked loop comprising an input, an output, a charge generator, a low pass filter, an oscillator and a frequency divider, the charge generator having a first input coupled to the input of the phase locked loop and an output coupled to an input of the low pass filter, the low pass filter having an output coupled to the input of the oscillator, the oscillator having an output coupled to both an input of the frequency divider and the output of the phase locked loop, and the frequency divider having an output coupled to a second input of the charge generator, the low pass filter having a first capacitor for integrating the charge produced by the charge generator, the capacitance of the first capacitor being selectable, the method comprising the steps of:

arranging the frequency divider to output a frequency equal to the frequency output by the oscillator divided by a selectable divider ratio;

arranging the charge generator to output a charge dependent upon the difference in phase between the signals at the first and second inputs to the charge generator, the output of the charge generator being such that, when the phase locked loop is in lock, the first and second inputs to the charge generator have a substantially constant phase relationship;

arranging the divider ratio and the capacitance of the first capacitor to be selectable so that they are proportional to each other; and arranging the frequency at the output of the oscillator to be dependent on the voltage at the output of the low pass filter.

14. A method of designing a plurality of phase locked loops as claimed in claim 11, wherein the low pass filter has a resistor, in series with the first capacitor, the method further comprising the steps of arranging the charge output by the charge generator to be proportional to a bias current, arranging the resistor to have a resistance inversely proportional to the square root of the bias current, and arranging the frequency output by the phase locked loop to be proportional to the square root of the bias current.

15. A method of designing a plurality of phase locked loops as claimed in claim 11, wherein the first capacitor of the loop filter comprises a plurality of capacitive elements connected in parallel, each capacitive element connected in series with a switching element, the switching means being arranged to operate the switching elements so as to determine the first capacitance of the loop filter.

16. A method of designing or manufacturing a plurality of phase locked loops or a method of controlling a phase locked loop as claimed in claim 15, wherein each capacitive element is arranged to have substantially the same capacitance and the number of switching elements that are set to be conducting is arranged to be equal to the selectable divider ratio.

17. A method of designing or manufacturing a plurality of phase locked loops or a method of controlling a phase locked loop as claimed in claim 15, wherein the capacitance of each capacitive element of the plurality is arranged to have a capacitance $C_k 2^i$ where $C_k$ is a constant and i is an index from 0 to n−1 where n is the number of elements in the plurality.

18. A method of designing or manufacturing a plurality of phase locked loops or a method of controlling a phase locked loop as claimed in claim 15, wherein the switching elements are NMOS transistors.

19. A method of designing or manufacturing a plurality of phase locked loops or a method of controlling a phase locked loop as claimed in claim 15, wherein the switching elements are PMOS transistors.

20. A method of designing or manufacturing a plurality of phase locked loops or a method of controlling a phase locked loop as claimed in claim 15, wherein the switching elements are transmission gates.

21. A method of designing a plurality of phase locked loops as claimed in claim 11, wherein the charge generator comprises a phase comparator and a charge pump, the output of the phase comparator arranged to be dependent on the phase relationship between the first and second inputs of the charge generator.

22. A method of designing or manufacturing a plurality of phase locked loops or a method of controlling a phase locked loop as claimed in claim 21, wherein the phase comparator has a first and a second output respectively coupled to a first and a second input of the charge pump, one of said phase comparator outputs is arranged to indicate that the first input of the phase comparator is advanced with respect to the second input and the other of the said phase comparator outputs is arranged to indicate that the first input of the phase comparator is retarded with respect to the second input, the inputs to the charge pump respectively arranged to cause the charge pump to increase or decrease the current input to the loop filter.

23. An Apparatus for carrying out the method of claim 11.

* * * * *